(12) United States Patent
Choi et al.

(10) Patent No.: US 7,923,793 B2
(45) Date of Patent: Apr. 12, 2011

(54) IMAGE SENSOR MODULE AND FABRICATION METHOD THEREOF

(75) Inventors: Min-seog Choi, Seoul (KR); Seung-wan Lee, Suwon-si (KR); Woon-bae Kim, Suwon-si (KR); Eun-sung Lee, Daejeon (KR); Kyu-dong Jung, Suwon-si (KR); Che-heung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 423 days.

(21) Appl. No.: 12/119,611

(22) Filed: May 13, 2008

(65) Prior Publication Data

US 2009/0115875 A1 May 7, 2009

(30) Foreign Application Priority Data

Nov. 1, 2007 (KR) .................. 10-2007-0111185

(51) Int. Cl.
*G01L 1/12* (2006.01)
(52) U.S. Cl. ............... 257/415; 257/E31.127; 257/432; 257/680; 250/208.1; 438/65; 438/116
(58) Field of Classification Search ........... 257/E31.127, 257/E31.124, E21.499, E21.5, E21.502, 415, 257/680, 432–434; 250/208.1, 239; 348/E5.091, 348/294; 438/65, 50, 48, 64, 69, 70, 116; 382/124–126
See application file for complete search history.

(56) References Cited

U.S. PATENT DOCUMENTS

| 5,510,273 | A  | * | 4/1996  | Quinn .......................... 156/160 |
| 5,650,363 | A  | * | 7/1997  | Endroes et al. ................. 438/57 |
| 6,486,541 | B2 | * | 11/2002 | Usami et al. ................... 257/679 |
| 6,791,072 | B1 | * | 9/2004  | Prabhu ....................... 250/208.1 |
| 6,881,943 | B1 | * | 4/2005  | Yegnashankaran ........ 250/208.1 |
| 7,507,944 | B1 | * | 3/2009  | Arnzen et al. ............. 250/208.1 |
| 7,626,621 | B2 | * | 12/2009 | Ito et al. ........................ 348/294 |
| 7,633,149 | B2 | * | 12/2009 | Fischer et al. ................ 257/701 |
| 7,786,421 | B2 | * | 8/2010  | Nikzad et al. .............. 250/208.1 |
| 2001/0020671 | A1 | * | 9/2001  | Ansorge et al. ............ 250/208.1 |
| 2002/0197771 | A1 | * | 12/2002 | Dotta et al. ................... 438/114 |
| 2004/0012698 | A1 | * | 1/2004  | Suda et al. .................... 348/315 |
| 2004/0023469 | A1 | * | 2/2004  | Suda ............................ 438/458 |
| 2005/0263836 | A1 | * | 12/2005 | Okada et al. ................. 257/415 |
| 2006/0038183 | A1 | * | 2/2006  | Oliver ............................ 257/79 |

FOREIGN PATENT DOCUMENTS

JP        2005-260436 A    9/2005

* cited by examiner

*Primary Examiner* — Chris Chu
(74) *Attorney, Agent, or Firm* — Sughrue Mion, PLLC

(57) ABSTRACT

An image sensor module having a sensor chip closely adhered on a concave surface and a fabrication method thereof are disclosed. The image sensor module includes at least one sensor chip, at least one sensor chip-mounting structure comprising a substrate and a polymer layer formed on the substrate, the polymer layer having an concave surface formed on an upper part thereof by a polymer molding method, so that the sensor chip is bent and bonded on the concave surface, and at least one lens fixed on the at least one sensor chip-mounting structure above the sensor chip.

23 Claims, 9 Drawing Sheets

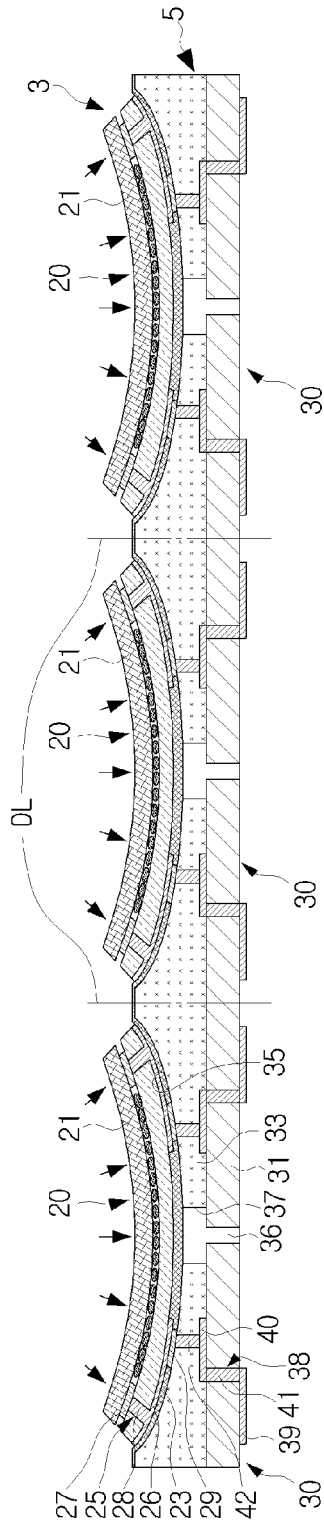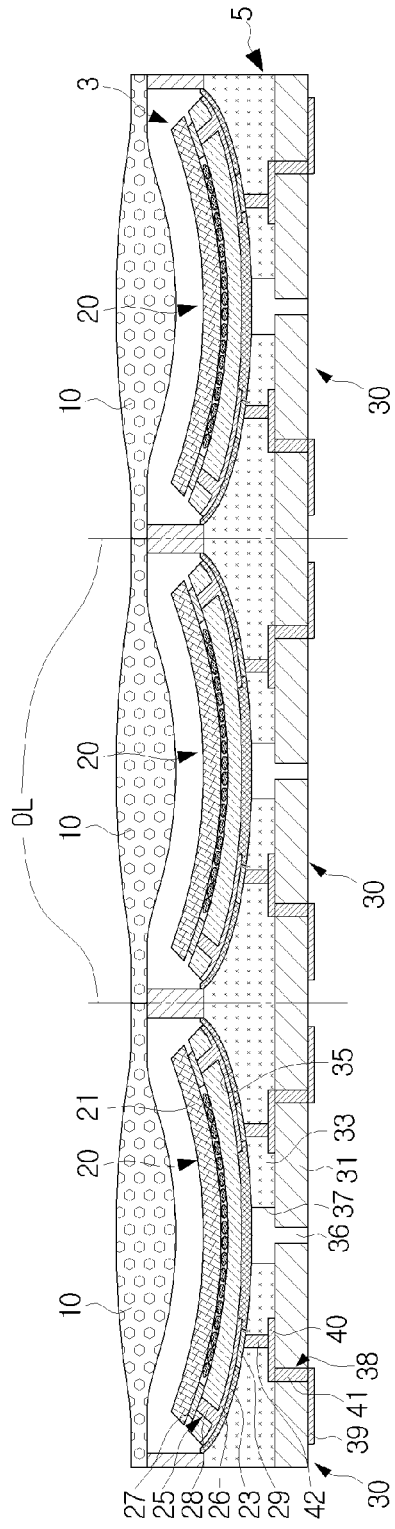

IMAGE SENSOR MODULE AND FABRICATION METHOD THEREOF

CROSS-REFERENCE TO RELATED PATENT APPLICATION

This application claims priority from Korean Patent Application No. 10-2007-0111185 filed on Nov. 1, 2007 in the Korean Intellectual Property Office, the disclosure of which is incorporated herein by reference.

BACKGROUND OF THE INVENTION

1. Field of the Invention

Apparatuses and methods consistent with the present invention relate to an image sensor module, which is used in an electronic device, such as a camera phone, a digital camera, etc. More particularly, the present invention relates to an image sensor module having a sensor chip closely adhered on a concave surface, and a fabrication method thereof.

2. Description of the Related Art

Generally, an electronic device, such as a camera phone, a digital camera, etc., has an image sensor module, which can take a photograph of a certain object. The image sensor module requires satisfying conditions including miniaturization, high resolution, and thinness, as well as price competitiveness.

However, a conventional typical image sensor module is configured, so that to calibrate an aberration caused by discordance between a focal plane of lens in the form of a curved surface and a sensor surface of a sensor chip in the form of a plane, a plurality of expensive aspheric lenses lies one upon another. Thus, the conventional image sensor module comes large in whole thickness, does not obtain sufficient high resolution, and causes fabrication costs to increase.

Also, the conventional image sensor module is configured, so that the sensor surface of the sensor chip is formed in the form of the plane. Thus, the conventional image sensor module presents a vignetting phenomenon that as pixels located at an edge of the sensor chip decrease in the intensity of received irradiation, images are become dark. To improve the vignetting phenomenon, some image sensor modules are configured, so that a pixel pitch at the edge of the sensor chip is larger than that at a center of the sensor chip, thereby calibrating the intensity of received irradiation. In this case, however, the image sensor module does not only come large in whole thickness, but also does not act to calibrate the intensity of received irradiation if it is operated to use a zoom function.

To address the problems described above, there recently has been proposed an image sensor module in which a sensor ship is thinned and bent to have a concave shape, thereby allowing the image sensor module to decrease in the number of lens and size and to improve the resolution. If the image sensor module is fabricated in a level of single part, however, it presents a problem in that when bonding the thinned sensor chips on corresponding concave surfaces of a silicon substrate one by one, it is difficult to precisely align the thinned sensor chips with the corresponding concave surfaces. In addition, if the image sensor module is fabricated in a wafer level, it presents a problem in that it is difficult to fabricate the concave surfaces to coincide with a pitch in an array of sensor chips through a conventional machining method and it is difficult or impossible to form metal via interconnections for electrical connection to penetrate the silicon substrate. Also, to bend the sensor chips in a certain curvature, for example, a radius of curvature of 10 mm, the sensor chips should be fabricated very thin, and there is required a separate complicated working apparatus for aligning and bonding the fabricated sensor chips with the corresponding concave surfaces.

SUMMARY OF THE INVENTION

Exemplary embodiment of the present invention addresses at least the above aspects. Accordingly, an aspect of the present invention is to provide an image sensor module having a sensor chip-mounting structure capable of improving efficiency and precision for forming a concave surface on which a sensor chip is bent and bonded, thereby reducing fabrication cost, and a fabrication method thereof.

Another aspect of the present invention is to provide an image sensor module and a fabrication method thereof capable of aligning and bonding a sensor chip with a concave surface without a separate complicated working apparatus for aligning and bonding the sensor chip with the concave surface, thereby improving precision in curved surface-bonding and alignment.

Other aspect of the present invention is to provide an image sensor module having a wiring part for electrical connection, which can apply surface mounted technology (SMT) and which does not need expensive wire bonding processes or soft PCBs for electrical connection.

Additional aspects of the invention will be set forth in part in the description which follows and, in part, will be obvious from the description, or may be learned by practice of the invention.

According to one aspect of an exemplary embodiment of the present invention, there is provided an image sensor module including at least one sensor chip, at least one sensor chip-mounting structure comprising a substrate and a polymer layer formed on the substrate, the polymer layer having an concave surface formed on an upper part thereof by a polymer molding method, so that the sensor chip is bent and bonded on the concave surface, and at least one lens fixed on the at least one sensor chip-mounting structure above the sensor chip.

Here, preferably, but not necessarily, the sensor chip at an upper surface thereof has an upper supporting layer formed of a transparent and flexible polymer and at a lower surface thereof has a lower supporting layer formed of a polymer or solder material having a melting point lower than that of the polymer of the upper supporting layer.

Preferably, but not necessarily, the polymer layer is formed of a resin.

Also, preferably, but not necessarily, the substrate and the polymer layer has first and second penetrated holes, which are communicated to each other, respectively. The first and the second penetrated holes form air discharging or drawing-in holes to easily bend the at least one sensor chip when the at least one sensor chip is bent and bonded on the concave surface.

The at least one sensor chip-mounting structure may further include a wiring part, which electrically connects a surface of the concave surface and a lower part of the substrate. The wiring part may be made up of at least one first and second wirings formed on a lower surface and an upper surface of the substrate, respectively, at least one first via interconnection penetrating the substrate to connect the at least one first and the second wirings, and at least one second via interconnection connected to the second wiring and formed to penetrate the polymer layer. At this time, preferably, but not necessarily, the second penetrated hole is formed so as not to expose the second wiring to the outside.

Alternatively, the wiring part may be made up of at least one first and second wirings formed on a lower surface and an upper surface of the substrate, respectively, at least one first via interconnection penetrating the substrate to connect the at least one first and the second wirings, and at least one metal bump or solder ball formed on the at least one second wiring. At this time, preferably, but not necessarily, the second penetrated hole is formed so as to expose a portion of the second wiring to the outside, and the metal bump or solder ball is formed on the portion of the second wiring exposed to the outside.

Preferably, but not necessarily, the at least one lens is fixed on the at least one sensor chip-mounting structure in a spaced-apart relation from the at least one sensor chip by at least one spacer. The at least one spacer may be formed by etching a silicon wafer or injection-molding plastic material. In addition, the at least one spacer may be integrally formed with the at least one lens.

In an exemplary embodiment, the at least one sensor chip may be a wafer in which a plurality of sensor chips is formed in a certain arrangement, the at least one sensor chip-mounting structure may be a wafer in which a plurality of sensor chip-mounting structures is formed in a certain arrangement, and the at least one lens may be a plurality of lenses bonded in a wafer level.

According to another aspect of an exemplary embodiment of the present invention, there is provided a fabrication method of an image sensor module including preparing a first wafer in which a plurality of sensor chips is formed in a certain arrangement, preparing a second wafer in which a plurality of sensor chip-mounting structures each having a concave surface is formed in a certain arrangement, partially dicing the first wafer in a predetermined depth, aligning and preliminarily bonding the first wafer with the second wafer, and bonding the plurality of sensor chips of the first wafer to corresponding concave surfaces of the sensor chip-mounting structures of the second wafer by bending the plurality of sensor chips while heating the first and the second wafers.

Here, the preparing the first may include forming an upper supporting layer on an upper surface of a sensor chip wafer, thinning a thickness of a first substrate of the sensor chip wafer, and forming a lower supporting layer and a first wiring of a first wiring part on a lower surface of the first substrate of the sensor chip wafer, the first wiring of the first wiring part being connected to a second wiring formed on an upper surface of the first substrate through a first via interconnection. Preferably, but not necessarily, the upper supporting layer is formed of a transparent and flexible polymer, and the lower supporting layer is formed of a polymer or solder material having a melting point lower than that of the polymer of the upper supporting layer.

The preparing the second wafer may include forming a portion of a second wiring part including a first wiring layer and a first penetrated hole penetrating a second substrate, on the second substrate, forming a polymer layer on the second substrate in which the first penetrated hole is formed, forming the concave surface, a via hole and a second penetrating hole, which communicates with the first penetrated hole, on or in the polymer layer, forming a third via interconnection of the second wiring part in the via hole, and forming a third wiring of the second wiring part by patterning the first wiring layer of the second substrate.

Here, the forming the portion of the second wiring part and the first penetrated hole on the second substrate may be made up of forming the first wiring layer on a lower surface of the second substrate, forming a second via interconnection in the second substrate, the second via interconnection penetrating the second substrate and being connected to the first wiring layer, forming a fourth wiring connected with the second via interconnection on an upper surface of the second substrate, and forming the first penetrated hole in the second substrate on which the first wiring layer and the fourth wiring are formed.

The forming the polymer layer may be made up of applying a resin, preferably, an epoxy resin, on the second substrate.

The forming the concave surface, the via hole and the second penetrating hole on or in the polymer layer may be made up of compressing the polymer layer by a polymer molding method of using a mold, which has a shape opposed to the concave surface, the via hole and the second penetrated hole.

Alternatively, the preparing the second wafer may include forming a portion of a second wiring part including a first wiring layer and a first penetrated hole penetrating a second substrate, on the second substrate, forming a polymer layer on the second substrate in which the first penetrated hole is formed, forming a second penetrating hole, which communicates with the first penetrated hole and exposes the portion of the second wiring part, in the polymer layer, forming the concave surface on an upper part of the polymer layer, the concave surface being formed, so that first penetrated hole is located on a center thereof, forming a metal bump or solder ball on the portion of the second wiring part exposed by the second penetrated hole, and forming a third wiring by patterning the first wiring layer of the second substrate.

Here, the forming the portion of the second wiring part and the first penetrated hole on the second substrate may be made up of forming the first wiring layer on a lower surface of the second substrate, forming a second via interconnection in the second substrate, the second via interconnection penetrating the second substrate and being connected to the first wiring layer, forming a fourth wiring connected to the second via interconnection on an upper surface of the second substrate, and forming the first penetrated hole in the second substrate on which the first wiring layer and the fourth wiring are formed.

The forming the polymer layer comprises applying a resin, preferably, an epoxy resin, on the second substrate.

The forming the second penetrating hole in the polymer layer may be made up of compressing the polymer layer by a polymer molding method of using a mold, which has a shape opposed to the second penetrated hole exposing the fourth wiring of the second wiring part.

The forming the concave surface on the upper part of the polymer layer may be made up of compressing the polymer layer by a polymer molding method of using a mold, which has a shape opposed to the concave surface.

The partially dicing the first wafer in the predetermined depth may include dicing only the upper supporting layer and the first substrate except for the lower supporting layer of the first wafer along a predetermined dicing line.

The aligning and preliminarily bonding the first wafer with second wafer may include aligning and arranging the dicing line or a separate aligning mark of the first wafer with an aligning mark of the second wafer, and bonding the lower supporting layer of the first wafer with an upper surface of the polymer layer of the second wafer.

The bonding the plurality of sensor chips of the first wafer to the corresponding concave surfaces may include melting an adhesive applied on the lower supporting layer or the concave surfaces by heating the first wafer in a predetermined temperature, bringing the respective sensor chips of the first wafer in contact with the corresponding concave surfaces by bending the respective sensor chips, and hardening the melted adhesive applied on the lower supporting layer or the concave surfaces.

The bringing the respective sensor chips in contact with the corresponding concave surfaces may include one of pressing the respective sensor chips against the corresponding concave surfaces by using a pressing plate, and compressing the respective sensor chips against the corresponding concave surfaces by absorbing air through first and second penetrated holes of the sensor chip-mounting structures with an air suction apparatus.

The fabrication method of the image sensor module according to another aspect of an exemplary embodiment of the present invention may further include fixing a single lens or a plurality of lens bonded in a wafer level on corresponding sensor chip-mounting structure of the second wafer. The fixing the single lens or the plurality of lens on the sensor chip-mounting structure may be made up of bonding at least one spacer on the corresponding sensor chip-mounting structure of the second wafer, and bonding the single lens or the plurality of lens bonded in the wafer level to the at least one spacer. At this time, the at least one spacer may be formed by etching a silicon wafer or injection-molding plastic material. In addition, the at least one spacer may be integrally formed with the single lens or the plurality of lens.

Other objects and salient features of the invention will become apparent to those skilled in the art from the following detailed description, which, taken in conjunction with the annexed drawings, discloses exemplary embodiment of the invention.

BRIEF DESCRIPTION OF THE DRAWINGS

The above aspects and features of the present invention will be more apparent from the description for exemplary embodiment of the present invention taken with reference to the accompanying drawings, in which:

FIGS. 2A through 2E are cross-sectional views exemplifying a method of fabricating the image sensor module illustrated in FIG. 1 in a wafer level;

Throughout the drawings, the same drawing reference numerals will be understood to refer to the same elements, features, and structures.

DETAILED DESCRIPTION OF ILLUSTRATIVE, NON-LIMITING EMBODIMENTS OF THE INVENTION

Figure 1:
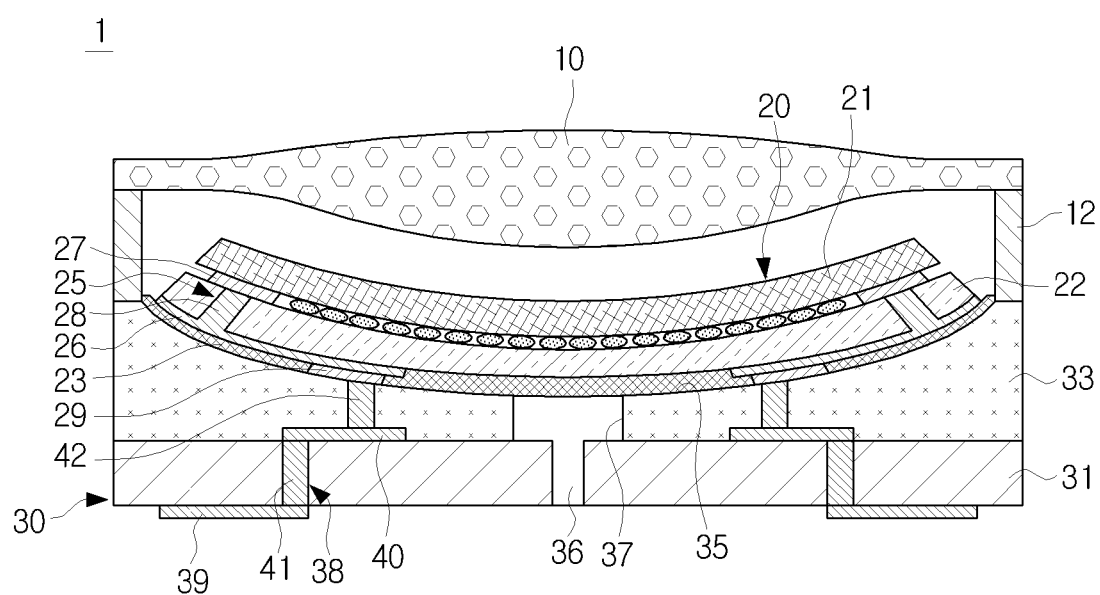
FIG. 1 is a cross-sectional view exemplifying an image sensor module in accordance with an exemplary embodiment of the present invention.

Reference will now be made in detail to an exemplary embodiment of the present invention, which are illustrated in the accompanying drawings, wherein like reference numerals refer to the like elements throughout. The exemplary embodiment is described below in order to explain the present invention by referring to the figures.

FIG. 1 is a cross-sectional view exemplifying an image sensor module 1 in accordance with an exemplary embodiment of the present invention.

As illustrated in FIG. 1, the image sensor module 1 in accordance with the exemplary embodiment of the present invention includes a lens 10, a sensor chip 20, and a sensor chip-mounting structure 30.

The lens 10 is made up of a low-priced spherical surface lens, and adhered and supported on the sensor chip-mounting structure 30 by a spacer 12, which is formed of a silicon or plastic material. The spacer 12 may be formed by etching a silicon wafer or injection-molding a plastic material.

The sensor chip 20, for example, is a CMOS image sensor (CIS) chip, and has at upper surface and lower surfaces, upper and lower supporting layers 21 and 23, respectively. The upper supporting layer 21 is formed of a transparent and flexible polymer, such as a polydimethlysiloxane (PDMS), a polymethyl methacrylate (PMMA), etc. The lower supporting layer 23, which closely adheres the sensor chip 20 on a concave surface 35 of the sensor chip-mounting structure 30, is formed of an adhesive, such as a polymer, a solder material, etc., having a melting point lower than that of the polymer of the upper supporting layer 21. The upper supporting layer 21 may be removed after the lower supporting layer 23 is formed or after the sensor chip 20 and the sensor chip-mounting structure 30 are bonded to each other. If the lower supporting layer 23 is used along with a separate adhesive, it acts as a supporting layer for the sensor chip 20. At this time, the separate adhesive may be applied on the lower supporting layer 23 or the concave surface of the sensor chip-mounting structure 30. In addition, the lower supporting layer 23 may act as an adhesive, as well as the supporting layer for the sensor chip 20, after it is melted and hardened. In this case, the lower supporting layer 23 is formed of an anisotropic conductive film or paste (ACF or ACP), a die attach film (DAF), etc. Also, the sensor chip 20 has a first wiring part 25 forming an electrical connection. The first wiring part 25 is made up of first and second metal wirings 26 and 27, a first via interconnection 28, and a conductive contact 29. The first and the second metal wirings 26 and 27 are formed between the lower supporting layer 23 and a first substrate 22 and between the upper supporting layer 21 and the first substrate 22, respectively. The first via interconnection 28 connects the first and the second metal wirings 26 and 27, and the conductive contact 29 is formed of a metal, such as Au, Al, etc.

The sensor chip-mounting structure 30 is made up of a second substrate 31 and a polymer layer 33. The second substrate 31 may be a silicon substrate or a glass substrate. The polymer layer 33 is formed of a resin, particularly, an epoxy resin, and at an upper part thereof has a concave surface 35 on which the sensor chip 30 is bent and bonded. Preferably, but not necessarily, the concave surface 35 has an inlet in the form of a circle or a tetragon (see FIG. 3H). Also, first and second penetrated holes 36 and 37, which communicate with each other, are formed in the second substrate 31 and the polymer layer 33, respectively. The first and the second penetrated holes 36 and 37 act as air discharging holes to allow the sensor chip 20 to be easily bent when the sensor chip 20 is pressed by a pressing plate (not illustrated) and thus bonded on the concave surface 35, and act as air suction holes when the sensor chip 20 is bent by an air suction apparatus (not illustrated) for drawing in air between the sensor chip 20 and the sensor chip-mounting structure 30 and thus bonded on the concave surface 35, as described later with reference to FIG. 2D.

The sensor chip-mounting structure 30 further includes a second wiring part 38, which electrically connects a surface of the concave surface 35 and a lower part of the second substrate 31. As illustrated in FIGS. 3G and 3H, the second wiring part 38 is made up of third and fourth metal wirings 39 and 40, a second via interconnection 41, and a third via interconnection 42. The third and the fourth metal wirings 39 and 40 are formed on lower and upper surfaces of the second substrate 31, respectively. The second via interconnection 41 is formed, so that it penetrates the second substrate 31 and connects the third and the fourth metal wirings 39 and 40. The third via interconnection 42 is connected to the fourth metal wiring 40, and formed to penetrate the polymer layer 33. At this time, preferably, but not necessarily, the second penetrated hole 37 is formed so as not to expose the fourth metal wiring 40 to the outside. As described above, since the sensor chip-mounting structure 30 has the second wiring part 38 including the third wiring 39 at the lower part of the second substrate 31, the image sensor module 1 does not need expensive wire bonding processes or soft PCBs for electrical connection, and can apply surface mounted technology (SMT). As a result, processes for assembling the image sensor module 1 in an electronic device are simplified, and fabrication costs are reduced.

Figure 4A:
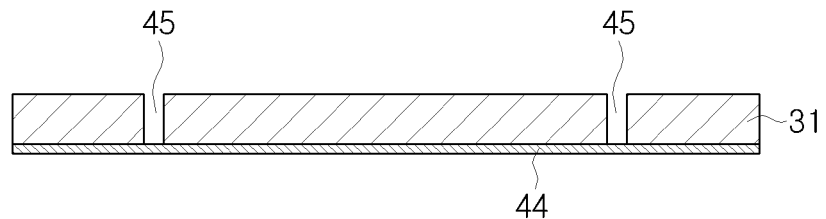
FIGS. 4A through 4H are cross-sectional views exemplifying another example of the method of fabricating the sensor chip-mounting structure of the image sensor module illustrated in FIG. 1.
Figure 4B:
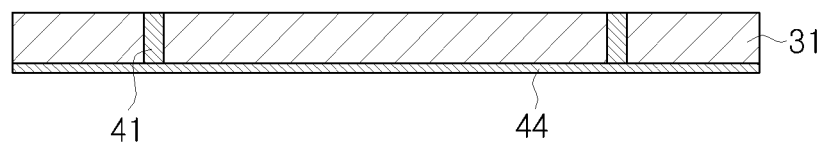
Figure 4C:
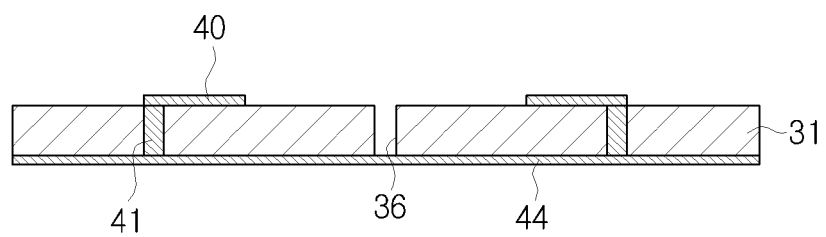
Figure 4D:
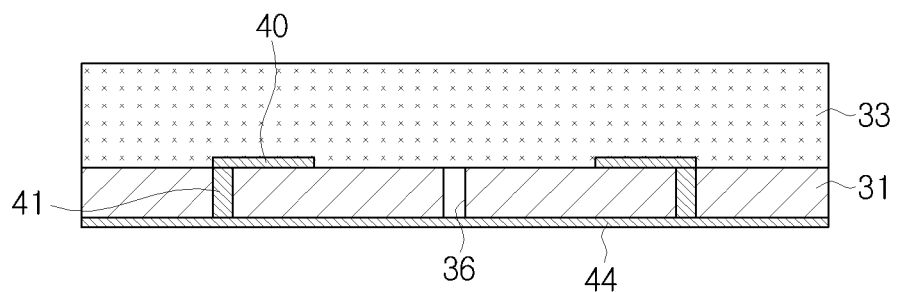
Figure 4E:
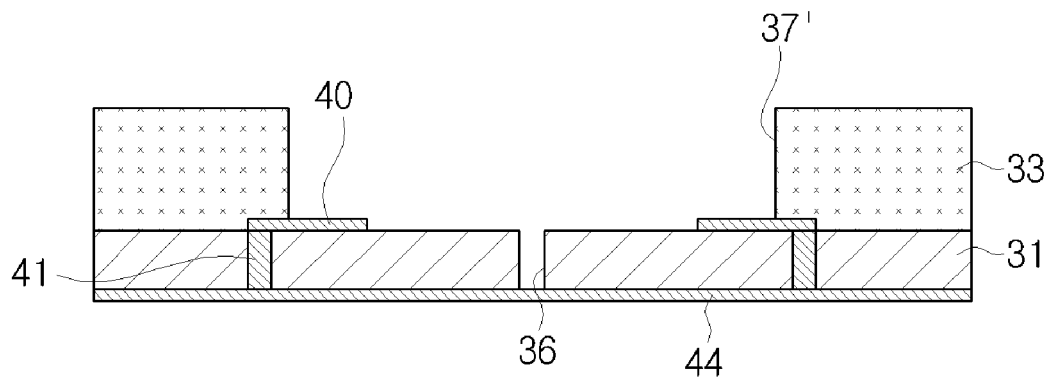
Figure 4F:
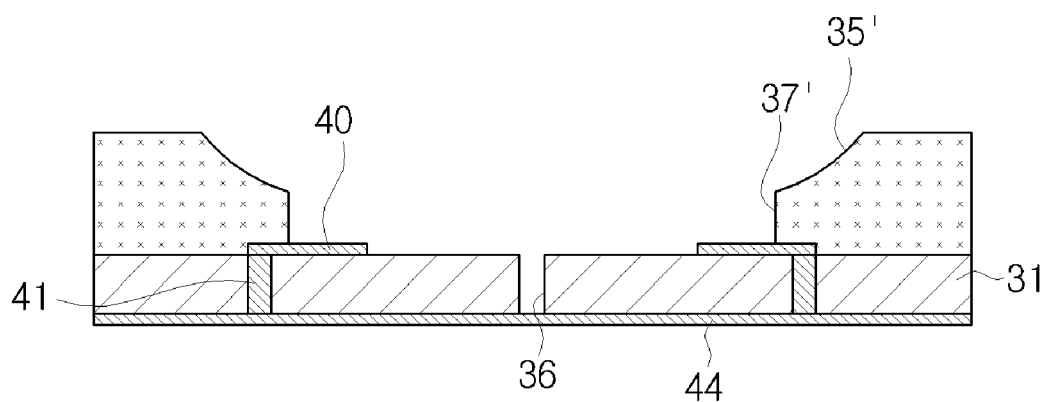
Figure 4G:
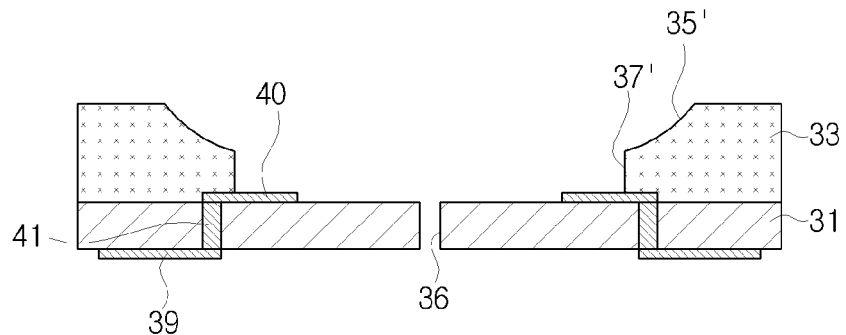
Figure 4H:
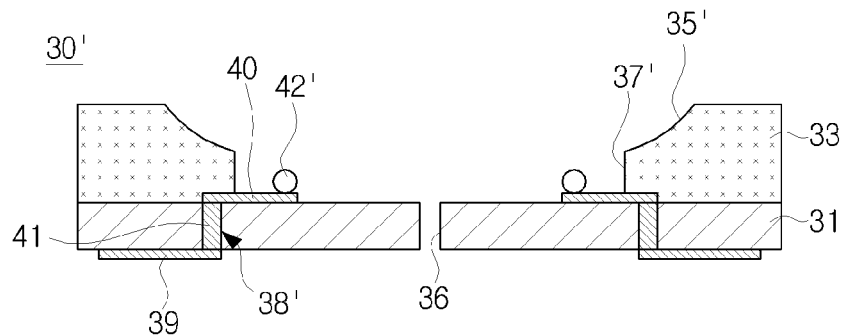
Figure 4I:
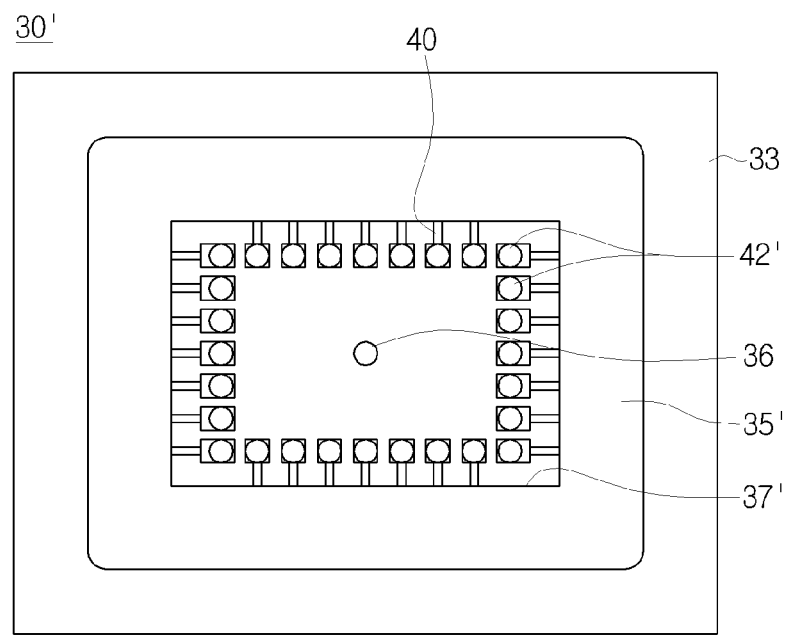
FIG. 4I is a top plan view of the sensor chip-mounting structure illustrated in FIG. 4H.

Alternatively, as illustrated in FIGS. 4H and 4I, a sensor chip-mounting structure 30' is provided with a second wiring part 38'. The second wiring part 38' is made up of third and fourth metal wirings 39 and 40, a second via interconnection 41, and a metal bump or solder ball 42'. The metal bump may be formed of a metal, such as Au, Ag, etc., and the solder ball may be formed of a solder material, such as Ag, Pb, etc. The third and the fourth metal wirings 39 and 40 are formed on lower and upper surfaces of the second substrate 31, respectively. The second via interconnection 41 is formed, so that it penetrates the second substrate 31 and connects the third and the fourth metal wirings 39 and 40. The metal bump or solder ball 42' is formed on the fourth metal wiring 40. At this time, preferably, but not necessarily, a second penetrated hole 37 'is formed to expose a portion of the fourth metal wiring 40 and the metal bump or solder ball 42' is formed on the fourth metal wiring 40 exposed to the outside.

In the above description, although the image sensor module 1 is illustrated and explained as being made up of one lens 10, one sensor chip 20, and one sensor chip-mounting structure 30 or 30', the present invention is not limited thereto. That is, since the image sensor module 1 is not fabricated in a level of single part, but in a wafer level in fabrication as described later with reference to FIGS. 2A through 3H, it may be made up of a plurality of lens 10 bonded in a wafer level, a sensor chip wafer 3 having a plurality of sensor chip 20, and a sensor chip-mounting wafer 5 having a plurality of sensor chip-mounting structure 30, as illustrated in FIG. 2E.

Hereinafter, a fabrication method of the image sensor module 1 according to the exemplary embodiment of the present invention constructed as described above will be in detail with reference to FIGS. 2A through 3H.

Figure 2A:
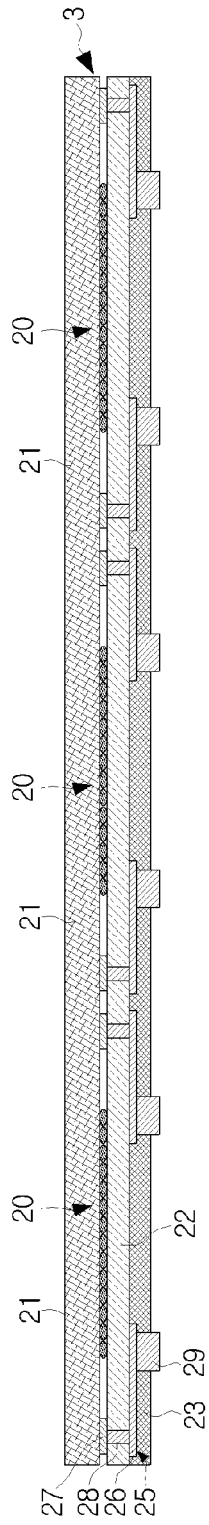
Figure 2B:
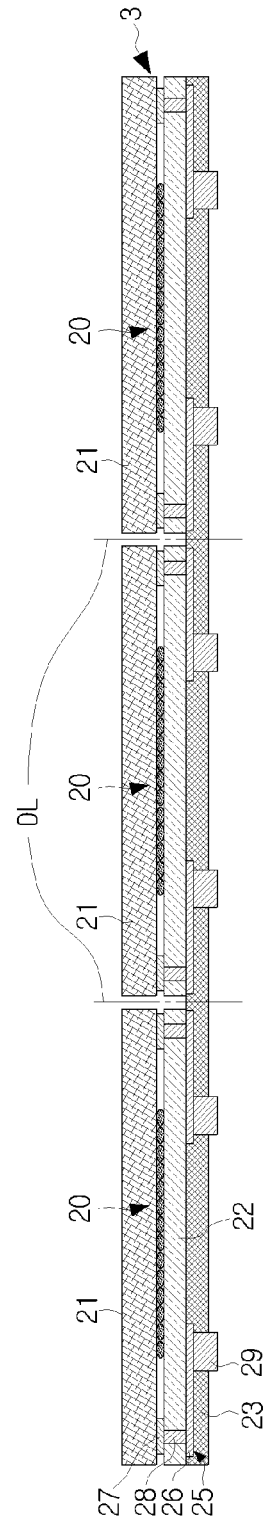

First, as illustrated in FIG. 2A, a sensor chip wafer 3 in which a plurality of sensor chips 20, for example, CIS chips, is formed in a certain arrangement is prepared.

To be more specific, an upper supporting layer 21 is formed of a transparent and flexible polymer, such as PDMS, PMMA, etc., on upper surfaces of a sensor chip wafer 3 having a plurality of charge injection device (CID) chips, each in which a second metal wiring 27 of a first wiring part 25, a first via interconnection 28, etc., are formed. Subsequently, to allow the sensor chip wafer 3 to bend in a certain curvature, for example, a radius of curvature of 9 mm, the sensor chip wafer 3 on which the upper supporting layer 21 is formed is thinned in a thickness of, for example, 30-50 μm by polishing a first substrate 21. Then, a metal layer, which is formed of a metal, such as Au, Al, etc., on a lower surface of the first substrate 22 of the sensor chip wafer 3, is pattered by a photolithography process. As a result, first metal wirings 26 of the first wiring parts 25 are formed on the lower surface of the first substrate 22. After the first metal wirings 26 are formed, a lower supporting layer 23 is formed on the whole of the lower surface of the first substrate 22. The lower supporting layer 23 is made up of ACF or ACP, or DAF, which is formed of a polymer or a solder material, such as Ag, Pb, etc., having a melting point lower than that of the polymer of the upper supporting layer 21. Thereafter, contacts 29, which are connected to the first metal wirings 26, are formed on the lower surface of the first substrate 22 of the sensor chip wafer 3. The contacts 29 are formed by forming via holes in a sanding method, a patterning method, etc., and then filling the via holes with a metal, such as Au, Al, etc., by an electroplating or a metal sputtering method. In the patterning method, to form the via holes, an adhesive layer, that is the lower supporting layer 23, is patterned by a photolithography process of using a via hole pattern formed of a photoresist as a mask. As a result, the preparation of the sensor chip wafer 3 is completed.

Figure 2C:
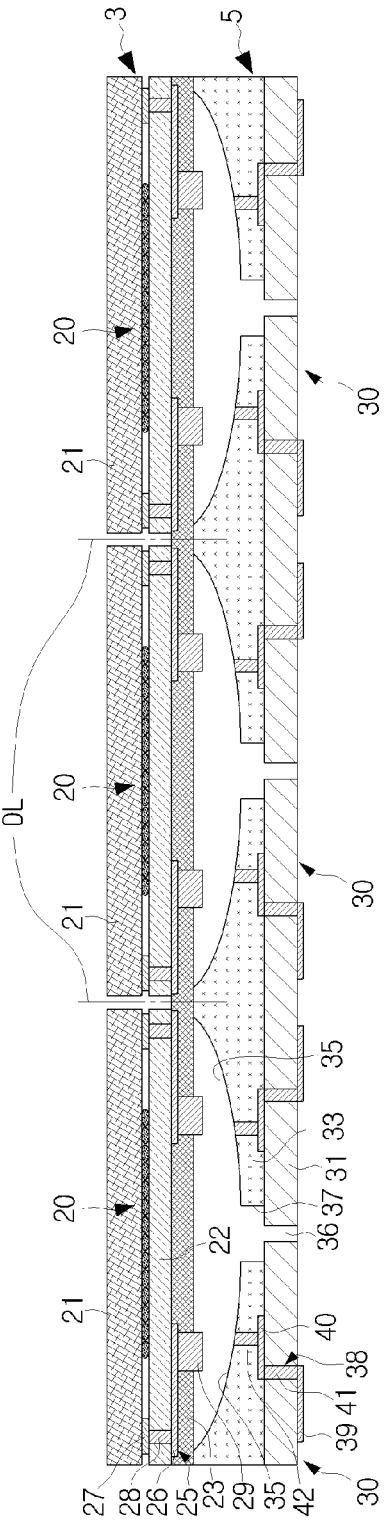

Next, as illustrated in FIGS. 2C, 3G and 3H, a sensor chip-mounting wafer 5 in which a plurality of sensor chip-mounting structures 30 each having a concave surface 35 is formed in a certain arrangement is prepared.

Figure 3A:
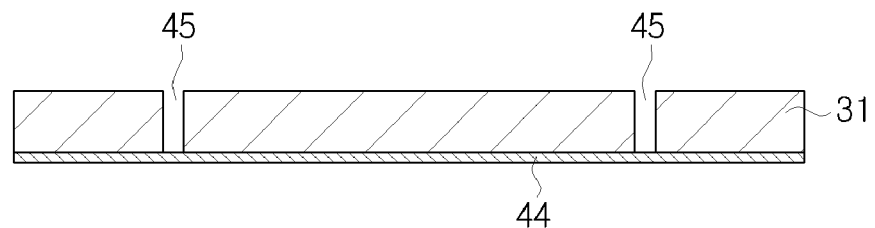
FIGS. 3A through 3G are cross-sectional views exemplifying an example of a method of fabricating a sensor chip-mounting structure of the image sensor module illustrated in FIG. 1.

To be more specific, as illustrated in FIG. 3A, after a second substrate 31 made of a silicon substrate or a glass substrate is prepared, a first wiring layer 44 is formed of a metal, such as Au, Al, etc., on a lower surface of the second substrate 31. Subsequently, first via holes 45 are formed in the second substrate 31 to penetrate the second substrate 31. The first via holes 45 are formed by a sanding method, a patterning method, etc. In the patterning method, to form the via holes 45, a first via hole pattern (not illustrated) is formed of a photo resist on the second substrate 31, and then the second substrate 31 is patterned by a photolithography process of using the first via hole pattern as a mask.

Figure 3B:
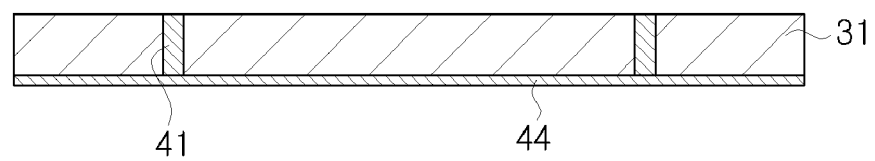

Next, as illustrated in FIG. 3B, second via interconnections 41 are formed in the first via holes 45 by a metal sputtering method or an electroplating method, which uses the first wiring layer 44 as an electrode. A second wiring layer (not illustrated) is formed of a metal, such as Au, Al, etc., on an upper surface of the second substrate 31 in which the second via interconnections 41 are formed. Then, the second wiring layer is patterned by a photolithography process, which forms a second via hole pattern (not illustrated) of photo resist on the second wiring layer and then patterns the second wiring layer using the formed second via hole pattern as a mask.

Figure 3C:
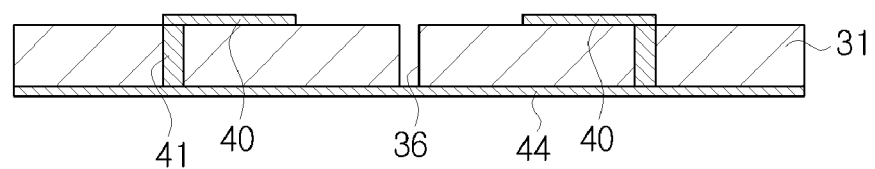

As a result, as illustrated in FIG. 3C, fourth metal wirings 40 are formed on the upper surface of the second substrate 31. First penetrated holes 36 are formed in the second substrate 31 on which the fourth metal wirings 40 are formed, by a photolithography process, a sanding method, etc. Each of the first penetrated holes 36 along with each of second penetrated holes 37 to be described later acts as an air discharging hole for discharging air in a space between the sensor chip 20 and the sensor chip-mounting structure 30 to allow the sensor chip 20 to be easily bent when the sensor chip 20 is pressed and bent by a pressing plate (not illustrated) and thus bonded on the concave surface 35 of the sensor chip-mounting structure 30, and acts as an air suction hole for drawing in the air in the space between the sensor chip 20 and the sensor chip-mounting structure 30 when the sensor chip 20 is bent by a suction force of an air suction apparatus (not illustrated) and bonded on the concave surface 35, as described later with reference to FIG. 2D.

Figure 3D:
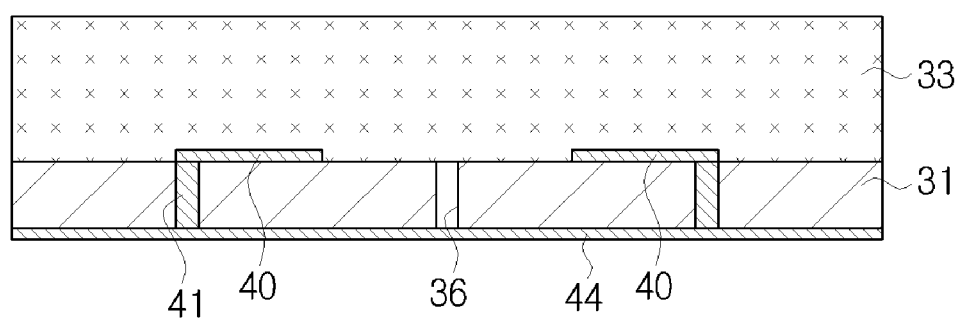

As illustrated in FIG. 3D, a polymer layer 33 for forming the concave surface 35 is formed of a resin, particularly, an epoxy resin, on the second substrate 31 in which the first penetrated holes 36 are formed. Next, the polymer layer 33 is compressed by a polymer molding method, such as a hot embossing or a replication, of using a mold (not illustrated), which has a shape opposed to the concave surfaces 35, the second via holes 46 and the second penetrated holes 37. At this time, to provide a reference for aligning the sensor chip wafer 3 with the sensor chip-mounting wafer 5 when bonding the sensor chip wafer 3 with the sensor chip mounting wafer 5, the mold may further include a pattern corresponding to a plurality of, for example, two aligning marks (not illustrated) in the form of a cross, which are formed on the sensor chip-mounting wafer 5 to coincide with a dicing line DL (see FIG. 2C) of the sensor chip wafer 3.

Figure 3E:
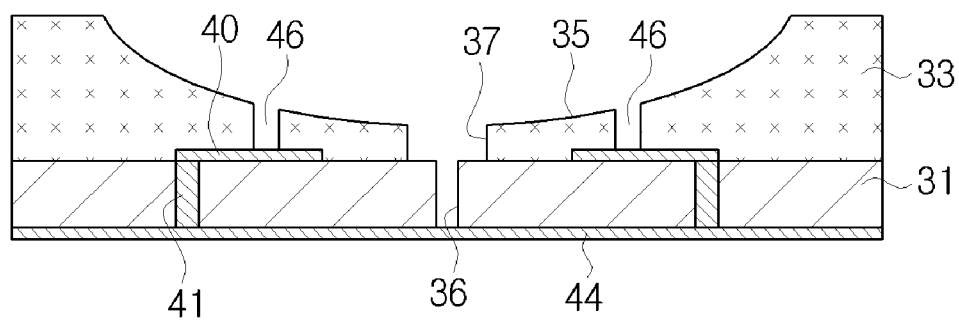

As a result, as illustrated in FIG. 3E, the concave surfaces 35, the second via holes 46 and the second penetrated holes 37 are formed on an upper part of the polymer layer 33. Thus, since the concave surfaces 35, etc., are formed by compressing the polymer layer 33 with the polymer molding method as described above, efficiency and precision for forming the concave surfaces 35, etc., are not only improved, but also it is possible to produce the sensor chip-mounting wafer 5 on a large scale, thereby reducing fabrication costs, as compared with a case of machining the concave surfaces, etc., by the conventional method. Subsequently, an ashing process is carried out to the polymer layer 33 in which the concave surfaces 35, the second via holes 46 and the second penetrated holes 37 are formed, and thereby remaining films, which are compressed and remained on the fourth metal wirings 40 in the hot embossing or the replication, are removed.

Figure 3F:
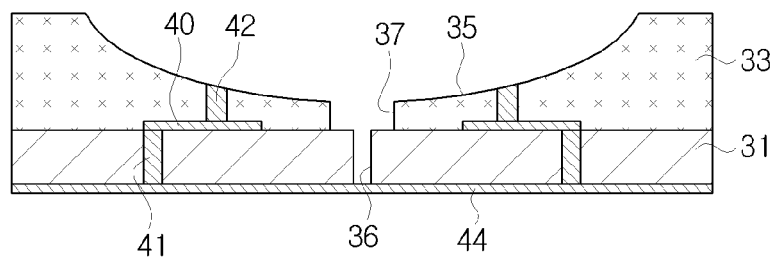
Figure 3G:
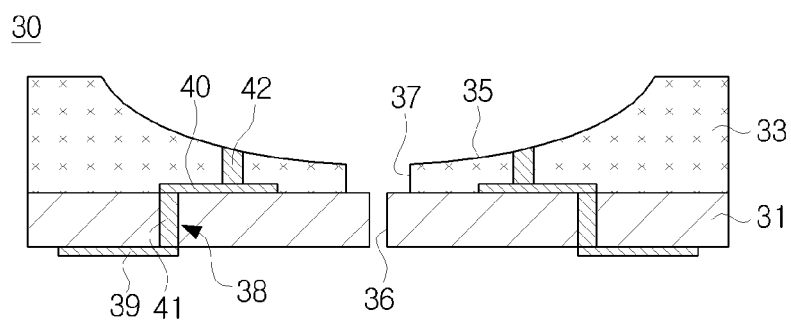
Figure 3H:
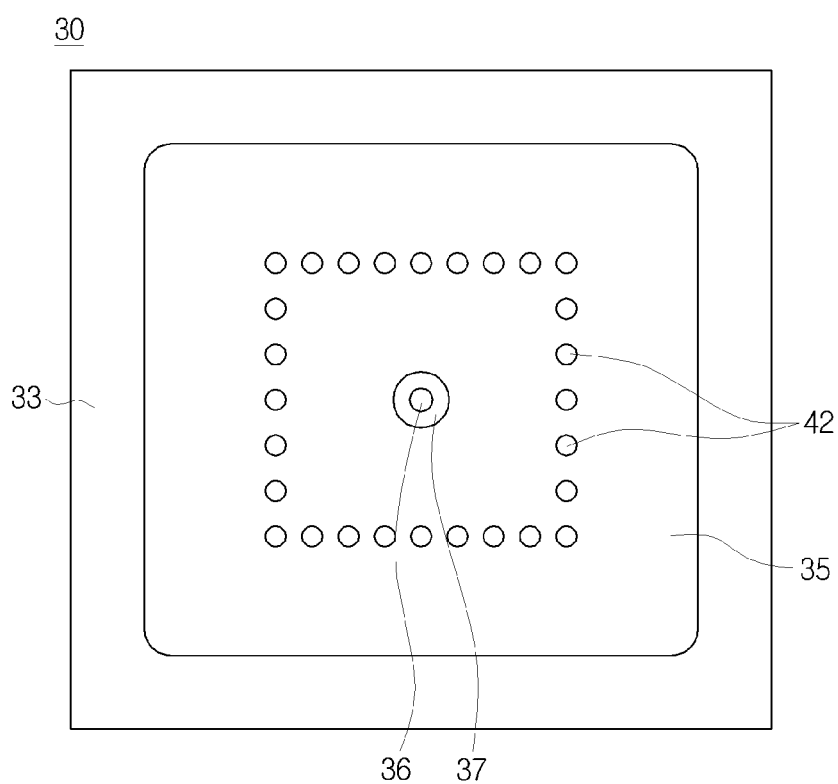
FIG. 3H is a top plan view of the sensor chip-mounting structure illustrated in FIG. 3G.

Then, as illustrated in FIG. 3F, third via interconnections 42 are formed in the second via holes 46 by an electroplating method or a metal sputtering method, which uses the first wiring layer 44, the second via interconnections 41 and the fourth metal wirings 40 as an electrode. Subsequently, like the second wiring layer, the first wiring layer 44 on the lower surface of the second substrate 31 is patterned by a photolithography process.

As a result, as illustrated in FIG. 3G, third metal wirings 39 are formed on the lower surface of the second substrate 31. Thus, the preparation of the sensor chip-mounting wafer 5 (see FIG. 2C) in which the plurality of sensor chip-mounting structures 30 is formed is completed.

Alternatively, as illustrated in FIGS. 4A through 4I, sensor chip-mounting structures 30' of the sensor chip-mounting wafer 5 may be fabricated as follows.

First, as illustrated in FIGS. 4A through 4D, second via interconnections 41, a first wiring layer 44, fourth metal wirings 40, first penetrated holes 36 and a polymer layer 33 are formed on or in the second substrate 31 in the same manner as explained with reference to FIGS. 3A through 3D. Next, the polymer layer 33 is compressed by a polymer molding method, such as a hot embossing or a replication, of using a penetrated hole mold (not illustrated), which has a shape opposed to second penetrated holes 37' each exposing portions of the fourth metal wirings 40. As a result, as illustrated in FIG. 4E, second penetrated holes 37 are formed in the polymer layer 33. Subsequently, an ashing process is carried out to the polymer layer 33 in which the second penetrated holes 37 are formed, and thereby, remaining films, which are compressed and remained on the fourth metal wirings 40 in the hot embossing or the replication, are removed. Subsequently, the polymer layer 33 is compressed by a polymer molding method, such as a hot embossing or a replication, of using a concave surface mold (not illustrated), which has a shape opposed to concave surfaces 35'. As a result, the concave surfaces 35' are formed on the upper part of the polymer layer 33 around the second penetrated holes 37'. Here, to provide a reference for aligning the sensor chip wafer 3 with the sensor chip-mounting wafer 5 when bonding the sensor chip wafer 3 with the sensor chip mounting wafer 5, the penetrated hole mold or the concave surface mold may further include a pattern corresponding to a plurality of, for example, two aligning marks (not illustrated) in the form of a cross, which are formed on the sensor chip-mounting wafer 5 to coincide with a dicing line DL of the sensor chip wafer 3. After forming the concave surfaces 35', as illustrated in FIG. 4G, the first wiring layer 44 on a lower surface of the second substrate 31 is patterned by a photolithography process like the second wiring layer. As a result, first metal wirings 39 are formed on the lower surface of the second substrate 31. Next, as illustrated in FIGS. 4H and 4I, metal bumps or solder balls 42' are formed of a metal, such as Au, Ag, etc., or a solder material, such as Ag, Pb, etc., on the fourth metal wirings 40. As a result, the preparation of the sensor chip-mounting wafer 5 with a plurality of sensor chip-mounting structures 30' is completed.

After the sensor chip wafer 3 and the sensor chip-mounting wafer 5 are prepared as described above, as illustrated in FIG. 2B, the sensor chip wafer 3 is diced only by a portion of predetermined thickness, that is, the upper supporting layer 21 and the first substrate 22 except for the lower supporting layer 23, along the dicing line DL, which is predetermined to coincide with a border surface between the sensor chip-mounting structures 30 or 30' of the sensor chip-mounting wafer 5.

As illustrated in FIG. 2C, the sensor chip wafer 3 is aligned, so that the dicing line DL or a separately formed aligning mark (not illustrated) thereof faces the aligning marks of the polymer layer 33 of the sensor chip-mounting structures 30 or 30' of the sensor chip-mounting wafer 5. Then, the lower supporting layer 23 located below the dicing line DL is preliminarily bonded on the upper surface of the polymer layer 33 of the sensor chip-mounting structures 30 or 30' by an adhesive.

Next, to bond the sensor chips 20 of the sensor chip wafer 3 on the corresponding concave surfaces 35 of the sensor chip-mounting structures 30 of the sensor chip-mounting wafer 5, the sensor ship wafer 3 and the sensor chip-mounting wafer 4 are heated in a predetermined temperature, for example, a temperature, which are lower that a melting point of the upper supporting layer 21 and higher than a melting point of the lower supporting layer 23 of the sensor chips 20, and at the same time, the respective sensor chips 20 of the sensor chip wafer 3 are bent and compressed to the corresponding concave surfaces 35. At this time, the respective sensor chips 20 are bent and compressed to the corresponding concave surfaces 35 by drawing in air between the sensor chips 20 and the sensor chip-mounting structures 30 with the air suction apparatus or pressing the sensor chips 20 against the concave surfaces 35 with the pressing plate. As a result, as illustrated in FIG. 2D, the contacts 29 and the lower supporting layers 23 of the sensor chips 20 and/or the separate adhesive (if in the preparation of the sensor chip wafer 3 and the sensor chip-mounting wafer 5, the separate adhesive is applied on the concave surfaces or the lower supporting layer 23) are melted, and bonded to the third via interconnections 42 and the concave surfaces 35 of the sensor chip-mounting structures 30, respectively.

As described above, the fabrication method of the image sensor module according to the exemplary embodiment of the present invention is configured to include dicing the sensor chip wafer 3 in which the plurality of sensor chips 20 is formed in the certain arrangement while leaving only the lower supporting layer 23 as it is, aligning the dicing line DL or the separate aligning mark of the sensor chip wafer 3 with the aligning marks of the sensor chip-mounting wafer 5, and then bonding the sensor chips 20 on the concave surfaces 35 or 35' of the sensor chip-mounting structures 30 or 30' by pressing the sensor chips 20 against the concave surfaces 35 with the pressing plate or absorbing the sensor chips 20 through the penetrated holes 36, 37 or 37' of the sensor chip-mounting structures 30 or 30' with the air suction apparatus to compress the sensor chips 20 against the concave surfaces 35 or 35'. Thus, to align and bond the sensor chips 20 with the concave surfaces 35, a separate complicated working apparatus is not required, and precision in curved surface-bonding and alignment is improved.

Thereafter, the sensor chip wafer 3 and the sensor chip-mounting wafer 5 bonded to each other are left as they are for a predetermined time until the contacts 29 and the lower supporting layers 23 of the sensor chips 20 and/or the separate adhesive (if in the preparation of the sensor chip wafer 3 and the sensor chip-mounting wafer 5, the separate adhesive is applied on the concave surfaces or the lower supporting layer 23) are hardened.

Next, as illustrated in FIG. 2E, spaces 12 fabricated in a predetermined height according to design conditions, such as a focal distance of lens, etc., are bonded on the polymer layer 33 of the sensor chin-mounting structures 30 of the sensor chip-mounting wafer 5. At this time, the spacers 12 may be formed by etching a silicon wafer or injection-molding plastic material. Thereafter, lenses of single part or a plurality of lens bonded in a wafer level are bonded on the spacers 12. Here, although the spacers 12 and the lenses 10 are illustrated as being bonded on the sensor chip-mounting wafer 5 in a state where they are separated from each other, they may be bonded on the sensor chip-mounting wafer 5 in a state where they are bonded to each other in advance.

Then the resultant image sensor module wafer in which the sensor chip wafer 3, the sensor chip-mounting wafer 5 and the lenses 10 are bonded to one another is diced along the dicing line DL to store in a sensor chip unit. As a result, the fabrication of the image sensor module 1 is completed.

Although an exemplary embodiment of the present invention has been shown and described, it will be appreciated by those skilled in the art that changes may be made in these embodiments without departing from the principles and spirit of the invention, the scope of which is defined in the claims and their equivalents.

What is claimed is:

1. An image sensor module comprising:
a sensor chip;
a sensor chip-mounting structure comprising a substrate and a polymer layer formed on the substrate, the polymer layer comprising a concave surface formed on an upper part thereof by polymer molding, so that the sensor chip is bent and bonded on the concave surface; and
at least one lens fixed on the sensor chip-mounting structure above the sensor chip;
wherein the sensor chip-mounting structure further comprises a wiring part which electrically connects a surface of the concave surface and a lower part of the substrate.

2. The module as claimed in claim 1, wherein the sensor chip comprises, at an upper surface thereof, an upper supporting layer formed of a transparent and flexible polymer and, at a lower surface thereof, a lower supporting layer formed of a polymer or solder material having a melting point lower than that of the transparent and flexible polymer of the upper supporting layer.

3. The module as claimed in claim 1, wherein the polymer layer further comprises a resin.

4. The module as claimed in claim 1, wherein the substrate comprises first penetrated holes, the polymer layer further comprises second penetrated holes, and the first and the second penetrated holes communicate with each other.

5. The module as claimed in claim 1, wherein the wiring part comprises:
a first wiring and a second wiring formed on a lower surface and an upper surface of the substrate, respectively;
a first via interconnection which penetrates the substrate and connects the first and the second wirings; and
a second via interconnection connected to the second wiring, which penetrates the polymer layer.

6. The module as claimed in claim 1, wherein the wiring part comprises:
a first wiring and a second wiring formed on a lower surface and an upper surface of the substrate, respectively;
a first via interconnection penetrating the substrate and connecting the first and the second wirings; and
one of a metal bump and a solder ball formed on the second wiring.

7. The module as claimed in claim 1, wherein,
the sensor chip comprises a wafer in which a plurality of sensor chips is formed in a first arrangement,
the sensor chip-mounting structure comprises a wafer in which a plurality of sensor chip-mounting structures is formed in a second arrangement, and
the at least one lens comprises a plurality of lenses bonded in a wafer level.

8. A fabrication method of an image sensor module comprising:
forming a first wafer in which a plurality of sensor chips is formed in a first arrangement;
forming a second wafer in which a plurality of sensor chip-mounting structures having concave surfaces, is formed in a second arrangement,
partially dicing the first wafer in a predetermined depth;
aligning and preliminarily bonding the first wafer with the second wafer; and
bonding the plurality of sensor chips of the first wafer to corresponding concave surfaces of the plurality of sensor chip-mounting structures of the second wafer by bending the plurality of sensor chips while heating the first and the second wafers.

9. The method as claimed in claim 8, wherein the forming the first wafer comprises:
forming an upper supporting layer on an upper surface of a sensor chip wafer;
thinning a thickness of a first substrate of the sensor chip wafer; and
forming a lower supporting layer and a first wiring of a first wiring part on a lower surface of the first substrate of the sensor chip wafer, the first wiring of the first wiring part being connected to a second wiring formed on an upper surface of the first substrate through a first via interconnection.

10. The method as claimed in claim 9, wherein,
the upper supporting layer is formed of a transparent and flexible polymer, and the lower supporting layer is formed of a polymer or solder material having a melting point lower than that of the transparent and flexible polymer of the upper supporting layer.

11. The method as claimed in claim 9, wherein the partially dicing the first wafer in the predetermined depth comprises dicing only the upper supporting layer and the first substrate except for the lower supporting layer of the first wafer, along a predetermined dicing line.

12. The method as claimed in claim 11, wherein the aligning and preliminarily bonding the first wafer with second wafer comprises:
   aligning and arranging the dicing line or a separate aligning mark of the first wafer with an aligning mark of the second wafer; and
   bonding the lower supporting layer of the first wafer with an upper surface of the polymer layer of the second wafer.

13. The method as claimed in claim 12, wherein the bonding the plurality of sensor chips of the first wafer to the corresponding concave surfaces comprises:
   melting an adhesive applied on the lower supporting layer or the concave surfaces by heating the first wafer in a predetermined temperature;
   bringing the respective sensor chips of the first wafer in contact with the corresponding concave surfaces by bending the respective sensor chips; and
   hardening the melted adhesive applied on the lower supporting layer or the concave surfaces.

14. The method as claimed in claim 13, wherein the bringing the respective sensor chips in contact with the corresponding concave surfaces comprises one of pressing the respective sensor chips against the corresponding concave surfaces by using a pressing plate, and compressing the respective sensor chips against the corresponding concave surfaces by absorbing air through first and second penetrated holes of the sensor chip-mounting structures with an air suction apparatus.

15. The method as claimed in claim 8, wherein the forming the second wafer comprises:
   forming a portion of a second wiring part including a first wiring layer and a first penetrated hole penetrating a second substrate, on the second substrate;
   forming a polymer layer on the second substrate in which the first penetrated hole is formed;
   forming the concave surface, a via hole and a second penetrating hole which communicates with the first penetrated hole, on or in the polymer layer;
   forming a third via interconnection of the second wiring part in the via hole; and
   forming a third wiring of the second wiring part by patterning the first wiring layer of the second substrate.

16. The method as claimed in claim 15, wherein the forming the portion of the second wiring part and the first penetrated hole on the second substrate comprises:
   forming the first wiring layer on a lower surface of the second substrate;
   forming a second via interconnection in the second substrate, the second via interconnection penetrating the second substrate and being connected to the first wiring layer;
   forming a fourth wiring connected to the second via interconnection on an upper surface of the second substrate; and
   forming the first penetrated hole in the second substrate on which the first wiring layer and the fourth wiring are formed.

17. The method as claimed in claim 15, wherein the forming the polymer layer comprises applying a resin on the second substrate.

18. The method as claimed in claim 15, wherein the forming the concave surface, the via hole and the second penetrating hole on or in the polymer layer comprises compressing the polymer layer by a polymer molding method of using a mold which has a shape opposed to the concave surface, the via hole and the second penetrated hole.

19. The method as claimed in claim 8, wherein the forming the second wafer comprises:
   forming a portion of a second wiring part including a first wiring layer and a first penetrated hole penetrating a second substrate, on the second substrate;
   forming a polymer layer on the second substrate in which the first penetrated hole is formed;
   forming a second penetrating hole, which communicates with the first penetrated hole and exposes the portion of the second wiring part, in the polymer layer;
   forming the concave surface on an upper part of the polymer layer, the concave surface being formed, so that first penetrated hole is located on a center thereof;
   forming a metal bump or solder ball on the portion of the second wiring part exposed by the second penetrated hole; and
   forming a third wiring by patterning the first wiring layer of the second substrate.

20. The method as claimed in claim 19, wherein the forming the portion of the second wiring part and the first penetrated hole on the second substrate comprises:
   forming the first wiring layer on a lower surface of the second substrate;
   forming a second via interconnection in the second substrate, the second via interconnection penetrating the second substrate and being connected to the first wiring layer;
   forming a fourth wiring connected to the second via interconnection on an upper surface of the second substrate; and
   forming the first penetrated hole in the second substrate on which the first wiring layer and the fourth wiring are formed.

21. The method as claimed in claim 20, wherein the forming the second penetrating hole in the polymer layer comprises compressing the polymer layer by a polymer molding method of using a mold which has a shape opposed to the second penetrated hole exposing the fourth wiring of the second wiring part.

22. The method as claimed in claim 19, wherein the forming the polymer layer comprises applying a resin on the second substrate.

23. The method as claimed in claim 19, wherein the forming the concave surface on the upper part of the polymer layer comprises compressing the polymer layer by a polymer molding method of using a mold which has a shape opposed to the concave surface.

* * * * *